United States Patent [19]

Rudeck

[11] Patent Number: 4,893,163

[45] Date of Patent: Jan. 9, 1990

[54] ALIGNMENT MARK SYSTEM FOR ELECTRON BEAM/OPTICAL MIXED LITHOGRAPHY

[75] Inventor: Paul J. Rudeck, Bronx, N.Y.

[73] Assignee: International Business Machines Corporation, Armonk, N.Y.

[21] Appl. No.: 173,832

[22] Filed: Mar. 28, 1988

[51] Int. Cl.$^4$ .............................................. H01L 27/02
[52] U.S. Cl. ............................................ 357/40; 357/55
[58] Field of Search ............................. 357/40, 55, 47

[56] References Cited

U.S. PATENT DOCUMENTS

| | | | |
|---|---|---|---|
| 4,338,620 | 7/1982 | Kawabe | 357/55 |
| 4,468,857 | 9/1984 | Christian et al. | 29/577 C |
| 4,660,068 | 4/1987 | Sakuma et al. | 357/55 |

OTHER PUBLICATIONS

IBM Technical Disclosure Bulletin, Vol. 27, #1B, Peressini et al., pp. 686-688, June, 1984.

*Primary Examiner*—Andrew J. James
*Assistant Examiner*—Mark Prenty
*Attorney, Agent, or Firm*—Sughrue, Mion, Zinn, MacPeak & Seas

[57] ABSTRACT

A system for making alignment marks in a semiconductor for a wafer etched in alignment with and bordered by an isolation level oxide. A silicon wafer has a film stack of silicon dioxide and silicon nitride. A pattern of data and alignment marks are exposed on the films and the device is processed to define a pattern or alignment mark positions on the silicon substrated bordered by the isolation oxide. The wafer is then patterned with a resist covering the device region and leaving exposed the alignment mark positions. The wafer is then etched to create the alignment mark pattern in the wafer while the device region is protected by the resist. The resist may then be removed and device processing continued.

4 Claims, 3 Drawing Sheets

ALIGNMENT MARK SYSTEM FOR ELECTRON BEAM/OPTICAL MIXED LITHOGRAPHY

BACKGROUND OF THE INVENTION

1. Field of the Invention

This invention relates to a method for manufacturing an semiconductor device and the resulting device. In particular, this invention relates to the structure and process of alignment marks to be used in mixed lithography systems for making semiconductor devices.

2. Related Art

Within the prior art lithography schemes are employed to produce a wide variety of devices. The most common are optical electron beam and X-ray. All have unique attributes and disadvantages. The art has proposed the mixing of these schemes to take advantage of the efficiencies and accuracy offered by them in various stages of device manufacturing. For example U.S. Pat. No 4,612,274 describes a method for using a combination of electron beam (E-beam) and photolithography in the manufacture of an acoustic wave device. The E-beam is used for purposes of writing fine lines which are required in an acoustic wave device while optical lithography is employed to delineate the large scale pad areas.

IBM Technical Disclosure Bulletin, Volume 1, No. 8, pp 3176–3177 (January 1979) relates to a combined E-beam and X-ray lithography process in the manufacture of semiconductor devices. This prior art recognizes that E-beam provides unique alignment capabilities but, at the same time, notes the inherent problems which exist when mixed lithography process are used in terms of maintaining proper registration alignment. The process employed in this TDB employs an alignment mark which is formed in the semiconductor wafer with that alignment mark maintained visible for E-beam registration by evaporating through metal topography which is used as a X-ray absorber for subsequent processing or maintaining rought alignment by means of visible topography in the X-ray absorber layer. As recognized however some comprise in the E-beam alignment accuracy results when relying on visible topography.

Other techniques for providing a registration mark for use with E-beam systems is disclosed in U.S. Pat. No. 3,710,101 and in IBM TDB, Volume 27, No. 1B, pp 686–688 (June 1984). In any scheme employing mixed lithography it is desirable to use the electron beam system for achieving maximum resolution on the critical device levels. The electron beam system is capable of achieving dimensional control that reaches 0.1 $\mu$m. In contrast, optical lithography begins to reach its limit at between 0.75 to 0.50 $\mu$m and requires a very small process window. Along with dimensional control, electron beam lithography also has the added advantage of superior overlay capability. To fully take advantage of the electron beam system, it is important that the critical device levels that will be written by the electron beam system, be aligned directly to the optically exposed isolation (ROX) level.

In the case of typical optical/E-beam mixed lithography processes, it is common to use a so-called "common zero level" alignment approach. In this technique, once the zero level has been established subsequent levels are written by both the optical and E-beam systems aligned to that zero level. This technique is limited by the fact that all levels are registered using second order alignment. A second order alignment is defined as the registration of one level to another indirectly aligning to a common level. Second order alignments have associated with them a higher degree of overlay error due, in part, to the summation of errors which exist for each of the two levels.

When employing a common zero level process the overlay is not only a second order alignment which, as indicated, is itself a problem, but is also limited by the alignment of the optical system. Stated differently the alignment which is achieved cannot be better than the alignment of the optical system to the common zero level. As such, even when using E-beam systems for purposes of a portion of the fabrication process, the level of registration is inherently limited to that which is achieved by the optical alignment. Thus, within the prior art a need exists to improve overlay accuracy when mathcing an E-beam lithography system to an optical lithography tool.

SUMMARY OF THE INVENTION

Given the clear advantages of E-beam lithography systems over optical systems in terms of the ability to register device levels more accurately, it would be clearly advantageous in a mixed lithography scheme to align to a particular level directly to the other level of interest. Such would be defined as a first order alignment. For example it would be preferable in the FET transistor process to align the gate level (poly) to the isolation level (ROX). Another example would be alignment of the emitter level to the ROX level in the case of a bipolar technique. In either, when the E-beam lithography system is aligned directly to the ROX level, the exposure system is then being used to its best advantage. That is, alignment can occur at the submicron level. Such achieves important advantages in that the optical system is then used to enhance through-put and the E-beam system may be used to maximize alignment and resolution.

while such desirabilities would find application in a pure E-beam system, problems occur in mixed lithography environments. The typical optical lithography system is capable of aligning to marks which ar defined at the ROX level. The profile of the isolation oxide is in of itself sufficient to be processed optically. Such however is not true for the E-beam system. Two problems arise when attempting to align to the isolation oxide profile. First, the slope of the oxide due to the so-called birds beak phenomena, does not permit sufficient contrast in signal as that mark is scanned. Secondly, the height difference in the active region to the top of the oxide is not sufficient. To date, no technique has been proposed or used which allows both the E-beam and an optical lithography scheme to align directly to the ROX level.

Therefore, it is an object of this invention to define an improved system of alignment for E-beam and optical mixed lithography systems.

It is further object of this invention to provide a scheme by which alignment marks may be produced at the isolation level in an early stage of semiconductor device development which will enable the electron beam system to align direct to it.

Yet another object of this invention is to provide the improved alignment scheme which reduces the inherent order of magnitude difference when alignment is predicated on common zero level approaches.

A further object of this invention is to provide improved alignment marks for mixed E-beam and optical lithography in the production of FET transistor structures and in particular to use a E-beam system in writing the gate level in the FET process.

Yet another object of this invention is to provide an alignment mark strategy which allows the E-beam system to align to the isolation level when the E-beam system is used to write the emitter level lines in a bipolar process.

These and other objects of this invention are accomplished in the method which able to align directly to an optically written level with an electron beam system, the alignment of the two levels to each other limited only by the alignment accuracy of the E-beam tool. The method provides a technique by which alignment marks are produced at the isolation level which enables the E-beam system to align directly to it. Thus in accordance with this invention no second order alignment is required.

Alignment marks are exposed along with data, that is the actual device data on the ROX level during device processing. The polarity is chosen so that the silicon nitrite is left on the marks after etching of the ROX level. The wafer is then processed in a standard manner to produce the devices up to and including the removal of silicon nitrite after oxidation. See, for example, "VLSI Technology", S.M. S, McGraw-Hill Book Company, Chapter 2 (1983). At this point in the process the marks will be silicon surrounded by isolation oxide. The wafer is then patterned with an appropriate resist so that only the alignment marks are unprotected by the resist. The ROX then is used as a self aligning mask and the wafer is etched in a standard manner for zero level alignment. See, "VLSI Technology", S.M. S, McGraw-Hill Book Company, Chapter 8, (1983). The result is marks which appear similar to those of standard zero level marks but are bordered by the ROX. Since the ROX is used as the mask the alignment marks are in perfect alignment to the ROX pattern because they were exposed along with it.

The resulting alignment structure is a series of trenches 1-2 μm deep surrounded by ROX. Such provides a very sharp transition for the E-beam to scan and provide the necessary back scatter electron wavelength to accurately pick off the edges of the alignment marks. This invention will be described by reference to the attached drawings and the description of the preferred embodiment that follows.

DESCRIPTION OF THE PREFERRED EMBODIMENTS

Figure 1A:
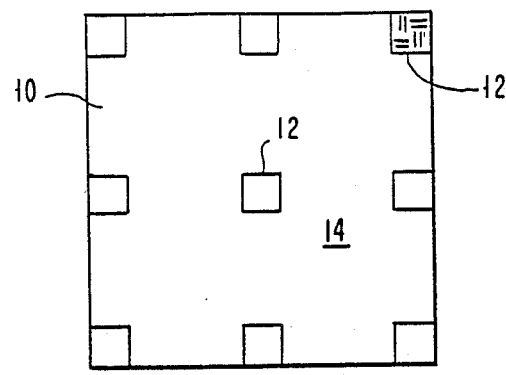
FIG. 1A is a schematic top view of a semiconductor wafer showing a typical location of alignment marks.
Figure 1B:
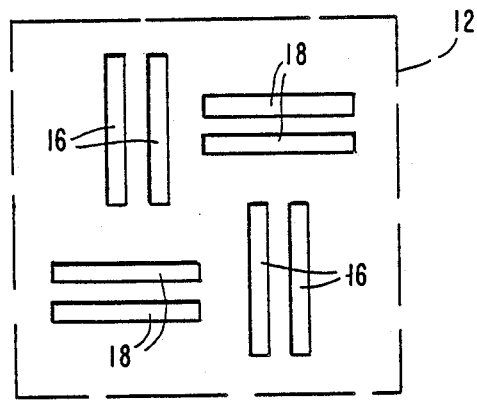
FIG. 1B is a partial view of the alignment mark topography of FIG. 1A.

Referring now to FIGS. 1A and 1B the basic topography for producing alignment marks on a silicon wafer is depicted. Figure 1A illustrates a typical wafer 10 having a series of alignment zones 12 while nine zones are illustrated it will be understood that such are positioned on the wafer purely as a function of a location to achieve the necessary alignment depending on the processing and equipment which is used. Moreover, FIG. 1A represents an exaggeration since the "real estate" occupied by the alignment zones 12 is, in reality, very small in comparison to the surface 14 of the wafer 10 which is used for device processing. The use of alignment marks per se on semiconductor wafers is established in the art. U.S. Pat. No 4,486,857 describes a scheme by which alignment marks are positioned on a side-by-side basis with individual integrated circuit structures. Thus, FIG. 1A illustrates merely one of a variety of design altnernatives for the placement of alignment mark zones vis-a-vis device processing areas.

Referring to FIG. 1B the enlargement of a typical alignment mark zone is depicted. An alignment pattern in the zone 12 comprises a series of eight features. Those features are grouped in paris and comprise trenches 16 etched into the surface of the wafer 10 in one orientation and pairs of trenches 18 etched into the silicon in an orthogonal direction. The alignment pattern depicted in FIG. 1B provides therefore a series of aligned trench walls provide the necessary relief for generation of back scattered electrons necessary to produce the edge-to-edge waveform transitions necessary to center the electron beam.

The process used to produce the pattern illustrated in FIG. 1B will now be described by reference to FIGS. 2–6. The description is for the manufacture of an FET. This is for purposes of illustration of the use of this invention in conjunction with an established process. The invention is not limited to the making of FET's. It will be further understood that with respect to certain of the processing steps delineated and described vis-a-vis those figures the processing of one parallel set of trenches produces a composite alignment mark structure illustrated in FIG. 1B.

Figure 2A:
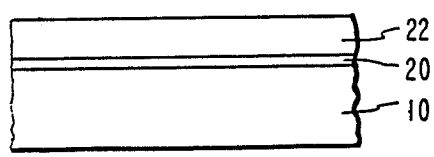
FIGS. 2A and 2B are schematic cross-sectional views of the process used to form the isolation oxide in device processing.
Figure 2B:
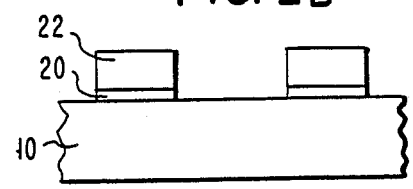

Referring now to FIG. 2A onto a silicon substrate 10 approximately 100 angstroms of $SiO_2$ is first deposited. Then, approximately 100 angstroms $Si_3N_4$ 22 is overlaid on the oxide. Referring to FIG. 2B the alignment marks to be formed are exposed along with the device data on the silicon substrate 10 using conventional patterning techniques. FIG. 2B illustrates the patterning of the alignment mark area of the wafer 10 after removal of the masks and the like. It would be understood that depending on the process used, at this step, in the device area regions would typically be formed. Reference is made to IBM TDB, Volume 15, No. 6, pp 1823–1825 (November 1972) which describes a series of steps used to produce FET structure. In accordance with this invention the polarity is chosen so that the $Si_3N_4$ remains on the marks after etching of the isolation level. Such is illustrated in FIG. 2B.

Figure 3:
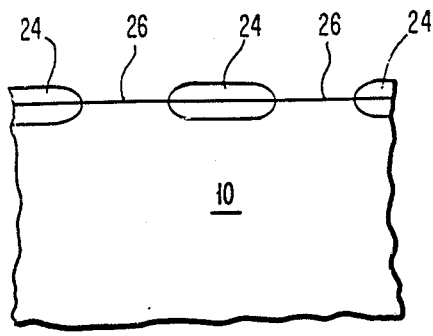
FIG. 3 is a schematic cross-sectional view of the ROX pattern produced.

Device processing then proceeds utilizing etching, for example reactive ion etching (RIE) up to and including the removal of the $Si_3N_4$ following oxidation. The processing of the marks at this point is illustrated in FIG. 3. The alignment pattern is therefore silicon surrounded by isolation level oxide (ROX) 24. The marks themselves will be created in the silicon zones 26 existing between the ROX 24.

Figure 4:
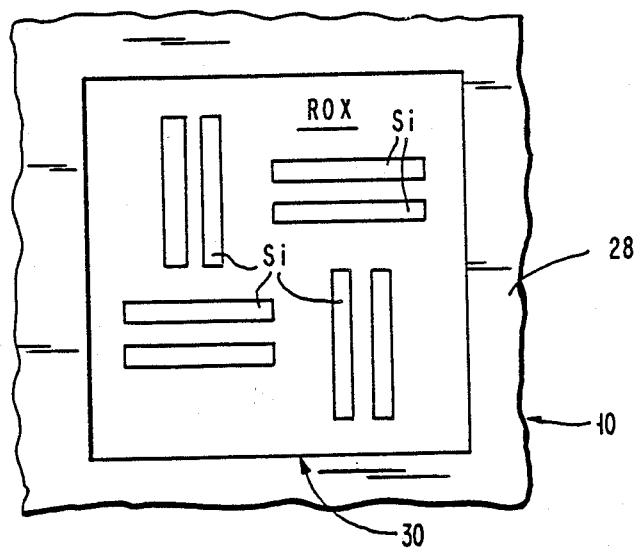
FIGS. 4 and 5 are respectively a schematic plan view and cross-sectional view of the patterning with resist in accordance with the next step of the process.
Figure 5:
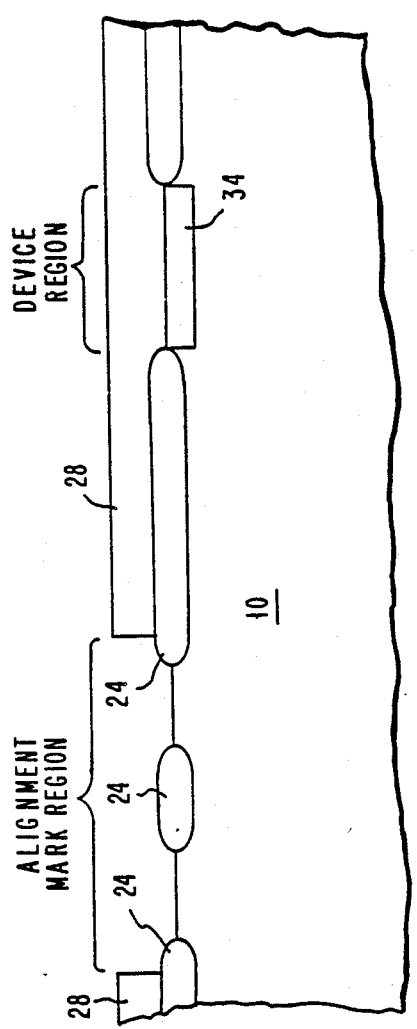

In accordance with this process, the wafer 10 is then patterned with a suitable resist 28 so that only the alignment marks are unprotected by the resist. FIG. 4 illustrates the zone 30 which is left unprotected by the resist 28. FIG. 5 illustrates in a side view how the patterning occurs so the area which is used to produce the alignment marks remains uncovered. As can be appreciated the ROX is thus used as the mask for etching into the silicon 10.

Figure 6:
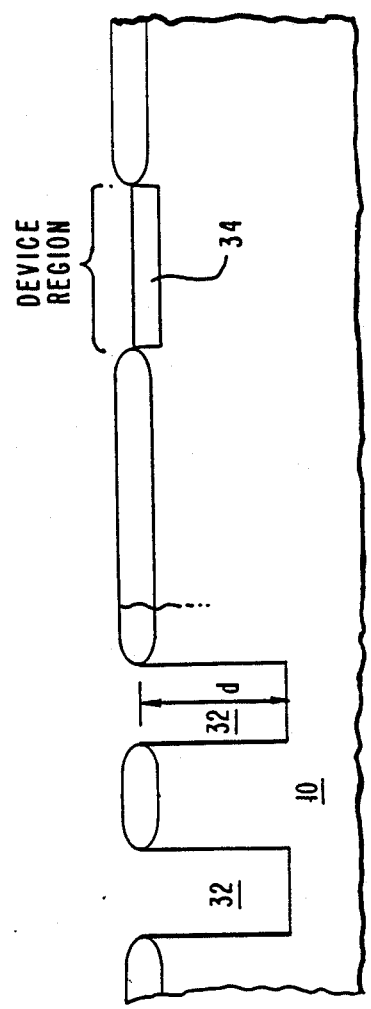
FIG. 6 is a schematic cross-sectional view illustrating a composite of alignment marks and a portion of a device structure so produced.

Utilizing the patterned resist structure having the resist 28 and isolation oxide 24 acting as a mask, the silicon is etched using standard techniques to produce a series of trenches 32 illustrated in FIG. 6. Those trenches have a depth D in the range of 1-$\mu$m. During the formation of those trenches which form a pair of alignment marks, for example, trenches 16 or 18 as illustrated in FIG. 1B, the patterning by the resist 28 protects the remainder of the wafer. It will be appreciated that the figures do not scale the device and alignment regions. For purposes of explanation, the alignment regions have been deliberately enlarged to illustrate the principles of this invention.

Thus, in accordance with this invention all that is required is the introduction of a non-critical masking step to produce the resist pattern illustrated in FIGS. 4 and 5 prior to etching to produce the trenches illustrated in FIG. 6.

By this technique the alignment marks are in alignment with the gate level polysilicon forming the FET structure 34 as illustrated in FIG. 6 with the isolation level in that same FET transistor process. This alignment provides a significant improvement in terms of packing density since it allows gain in overlay accuracy in the range of 0.2–0.3 $\mu$m improvement. Such therefore facilitates the use of a E-beam to generate fine lines and therefore higher density the definition of the FET gate structure.

Similar improvements can also be achieved by aligning the emitter to the ROX in the case of bipolar devices.

Processing then proceeds in accordance with known techniques utilizing the alignment marks as produced by this invention to align both E-beam and optical devices. For example, the E-beam could be used to write fine lines while optical processing is employed as a conventional lithography step. The system however aligns to the level of accuracy of the device being employed and not to a second order.

It can be appreciated that this technique is not limited to the FET process when in fact is is usable for any transistor process whether it is FET, bipolar/Si or GaAs. In all of those processes, a ROX level is used as the first lithography level. By the use of this invention the inherent disadvantages of prior art systems are overcome. Trenches themselves provide the necessary height difference in the alignment marks to provide sharp transition in back scatter electron level. The system is not dependent on a second order alignment yet it allows the E-beam system to align to its own marks while having the optical lithography align to the profile of the oscillation oxide.

Thus, this improved alignment mark structure/process allows for the first order alignment of an E-beam system to the isolation level (ROX) during the subsequent lithography levels.

This technique can be used to produce any type of integrated circuit/transistor that requires a ROX structure. The ROX level does not need to be the first lithography level, but it would be preferred. Also, this mark would be good for all levels exposed after the ROX level and not limited to the poly or the emitter level, for example contact, metal and via levels.

It is apparent that modifications of this invention may be practiced without departing from the essential scope thereof.

Having described my invention I claim:

1. A semiconductor wafer comprising:
   a series of semiconductor devices produced on said wafer, and a series of alignment marks etched into said wafer in alignment with and bordered by an isolation level oxide.

2. The semiconductor wafer of claim 1 where said alignment marks are parallel trenches having a depth in the range of 1-2 microns.

3. The semiconductor wafer of claim 2 wherein said parallel trenches are arrayed in parallel pairs positioned perpendicular to each other.

4. The device of claim 1 wherein said alignment marks are positioned in different locations ont he edge of said wafer.

* * * * *